United States Patent [19]
Tran et al.

[11] Patent Number: 5,808,938
[45] Date of Patent: Sep. 15, 1998

[54] METHOD AND APPARATUS FOR READING ANALOG VALUES STORED IN FLOATING GATE NAND STRUCTURES

[75] Inventors: Hieu Van Tran, San Jose; James Brennan, Jr., Saratoga, both of Calif.; Trevor Blyth, Sandy, Utah; Sukyoon Yoon, Saratoga, Calif.

[73] Assignee: Information Storage Devices, Inc., San Jose, Calif.

[21] Appl. No.: 887,307

[22] Filed: Jul. 2, 1997

Related U.S. Application Data

[62] Division of Ser. No. 629,729, Apr. 9, 1996, Pat. No. 5,726,934.

[51] Int. Cl.$^6$ .................................................. G11C 27/00
[52] U.S. Cl. .......................... 365/185.2; 365/185.21; 365/210; 365/203; 365/205; 365/185.03
[58] Field of Search ............................ 365/189.01, 185.2, 365/185.21, 210, 203, 205, 185.03

[56] References Cited

U.S. PATENT DOCUMENTS

| | | | |
|---|---|---|---|
| 4,890,259 | 12/1989 | Simko . | |
| 4,939,690 | 7/1990 | Momodomi et al. . | |
| 4,959,812 | 9/1990 | Momodomi et al. . | |
| 4,989,179 | 1/1991 | Simko . | |
| 5,117,394 | 5/1992 | Amin et al. | 365/203 |
| 5,126,967 | 6/1992 | Simko . | |
| 5,164,915 | 11/1992 | Blyth . | |
| 5,191,552 | 3/1993 | Nakai et al. | 365/189.01 |
| 5,197,028 | 3/1993 | Nakai | 365/185.03 |
| 5,220,531 | 6/1993 | Blyth et al. . | |
| 5,241,494 | 8/1993 | Blyth et al. . | |
| 5,243,239 | 9/1993 | Khan et al. . | |
| 5,258,958 | 11/1993 | Iwahashi et al. | 365/210 |
| 5,294,819 | 3/1994 | Simko . | |
| 5,321,699 | 6/1994 | Endoh et al. | 371/21.5 |
| 5,352,934 | 10/1994 | Khan . | |
| 5,388,064 | 2/1995 | Khan . | |
| 5,487,045 | 1/1996 | Trodden . | |
| 5,553,295 | 9/1996 | Pantelakis et al. . | |
| 5,717,640 | 2/1998 | Hashimoto | 365/189.07 |
| 5,726,934 | 3/1998 | Tran et al. | 365/185.2 |

FOREIGN PATENT DOCUMENTS

57-176598  10/1982  Japan .

Primary Examiner—Viet Q. Nguyen
Attorney, Agent, or Firm—Blakely, Sokoloff, Taylor & Zafman LLP

[57] ABSTRACT

This invention utilizes the small cell size of the NAND storage cell structure in an analog storage and playback device. This is achieved, in part, by using a special, zero current storage cell, in which in the read mode, the cell loading current is waveshaped to attain an optimal dynamic range and to avoid the resistive effects of series parasitic resistances of other transistors in the source node or drain node, and to avoid the transistor conductance variations of all the transistors in the read path. The loading current is waveshaped to reduce possible overshoot and settling effects to achieve the fine output voltage resolution in an optimal sensing time. Details of the method and alternate embodiments are disclosed.

7 Claims, 4 Drawing Sheets

METHOD AND APPARATUS FOR READING ANALOG VALUES STORED IN FLOATING GATE NAND STRUCTURES

This is a divisional application of application Ser. No. 08/629,729, filed Apr. 9, 1996, now U.S. Pat. No. 5,726,934.

BACKGROUND OF THE INVENTION

1. Field of the Invention

The present invention relates to the field of integrated circuit design, specifically to analog signal recording and playback utilizing non-volatile memory integrated circuits.

2. Prior Art

For analog signal recording and playback utilizing non-volatile memory integrated circuits, as described in the patent numbered 5,220,531 by Trevor Blyth and Richard Simko, EEPROM (electrically erasable programmable read only memory) memory cells are used. These cells are comprised of a floating gate device having a source, a drain, a gate and a floating gate wherein the threshold of the device as measured between the gate and the source of the device is determined (controlled) by the charge on the floating gate. These cells are erased using Fowler-Nordheim tunneling by applying a high voltage, e.g. 21V on the gate, zero volts on the source, and zero volts on the drain. The high voltage on the gate capacitively couples to the floating gate, which creates a high electric field through the tunnel oxide between the floating gate and the drain. This electric field causes electrons to tunnel to the floating gate, which effectively raises the Vt (threshold voltage) to about 6V. Next the cell is programmed using the same Fowler-Nordheim tunneling mechanism by applying a high voltage on the drain, e.g. 9 to 19 volts, zero volts on the gate, and 6V on the source. The high voltage on the drain causes a high electric field through the tunnel oxide between the floating gate and the drain in the reverse direction. This causes electrons to tunnel from the floating gate to the drain, causing the threshold voltage to be lower (depleted), e.g. −1V to +3V, depending on the voltage level on the drain and the pulse width.

In U.S. Pat. No. 5,220,531, the program "pulse" is divided into a series of coarse pulses and a series of fine pulses to store an analog signal in the non-volatile memory cell. After each programming pulse, the content of the cell is read using a read cycle and compared with the analog signal to be stored, with the coarse pulses terminating when the desired programmed level is approached, and the fine pulses terminating when the desired programmed level is reached. The coarse write/read/compare series followed by the fine write/read/compare series provides superior analog signal resolution in the stored signal.

In the above patent, the dynamic range of the cell is about 3V, with an analog resolution of about 12 millivolts, giving an effective resolution equivalent to a digital storage of 8 bits (each cell has a resolution of 12/3000, or about 1 part in 250). Each coarse pulse or fine pulse is divided into a ramp up time portion and a flat time portion equally of the high voltage, and a sample and compare enable time portion. The compare time portion is used to read back the voltage stored in the memory cell after each incremental coarse or fine programming pulse to see if it reaches a desired value. The sample time portion is used to sample the next sample of input signal and hold it. The sample and compare time portion is the quiet time, i.e. the high voltage source such as the charge pump is disabled for noise reasons. The step voltage between successive coarse levels is approximately 220 millivolts and the step voltage between successive fine levels is approximately 22 millivolts, which is equivalent to a resolution of 12 mV in the stored voltage in the memory cell. The large step voltage for the coarse levels is required to cover the full range of the cell programming threshold window plus an additional voltage margin, which ranges from approximately 9 to 19 volts on the drain of the memory cell, corresponding to about 0–3v of the memory cell threshold voltage, approximately the analog dynamic range of the memory cell. The number of coarse pulses available is chosen to be 45, which translates into 45×220 mV=10 volts full range. The large coarse step is used to achieve the short writing time. The fine ramp full range is chosen to be about 2V. 90 fine pulses are available, giving a writing resolution of about 22 mV. Thus the number of column sample and hold/high voltage drivers is defined by the sampling rate together with the cell programming time. For example, for sampling rate of 8 Khz (typical audio signal), and a cell programming time of 12.5 ms with the above coarse and fine pulses, the number of column sample and hold/high voltage drivers are 12.5 ms/125 $\mu$s=100. This also means the cell writing is happening for 100 columns at the same time.

In the read mode, the storage cell is configured as a source follower with a constant load current from the drain to ground. The gate and the source of the memory cell are connected together, the drain of the memory cell is connected to a constant bias current, the gate of the select transistor is connected to an intermediate voltage, e.g. 10V, to eliminate the gate voltage drop effect and the resistive effect from the small size of the select gate. A regulated power supply, e.g. 4V, is connected to the gate/source of the memory cell to avoid the variation of the gate/source voltage on the cell readout voltage. The voltage at the drain is the memory cell readout voltage. Thus the cell is connected as a source follower with the drain and source interchanged. This results in a linear relationship between the threshold of the cell and the cell readout voltage. The storage cell is thus operated in the saturation region since the gate and source are effectively tied together.

In this read configuration, severe disadvantages are encountered when used in a configuration wherein there are series parasitic resistive effects on the source node or the drain node, or there are large variations in the transistor conductances such as are caused by mobility or threshold voltage variations over temperature, process variations or power supply variations. The series parasitic resistive effects, for example, come from the source diffusion resistance of the memory cells, or from other series transistors as in a string memory cell structure such as in a NAND flash memory cell. The source line is typically strapped, e.g., for every 32 cells, by metal or select transistors to reduce resistance from the source line diffusion. Even so, the resistance from the source line diffusion is still very significant, especially for multilevel storage wherein each discrete storage level is to be discernible on readout from each other discrete level. Furthermore, the more effective the strap in reducing these effects, the more strap area is used, resulting in a larger die size.

The NAND memory cell consists of a string of, for example, 8 memory cells in series, and 2 select transistors to select the memory string, one select transistor contact being shared with another memory cell string. Since in effect there is only one-half a bitline contact and one-half a common source line for the 8 memory cells, the per-cell area of the NAND configuration is much smaller. However the series parasitic resistances and transistor conductance variations of this configuration cause voltage drops along the source or drain nodes which lower the dynamic range of the memory cell. More severe in the NAND structure, if considered for analog storage, is the fact that this voltage drop causes the output voltage of one particular cell in a string to be different in the read-back mode of the read/compare/write programming sequence than in the actual read mode for output or playback purposes, since the threshold voltages of other memory cells in the same string are frequently to be further modified depending on the signal inputs. Thus, a first cell in a string can appear to be properly programmed, but one or more other cells in the string require further programming by further programming pulses, so that these cells will have a different resistance when the contents of the first cell are to be later read out during playback from the resistance that existed when the first cell was determined to be properly programmed.

BRIEF SUMMARY OF THE INVENTION

It is an object of this invention to utilize the small cell size of the NAND storage cell structure in an analog storage and playback device. This is achieved, in part, by using a special, zero current source follower storage cell, in which in the read mode, the cell loading current is waveshaped to attain an optimal dynamic range and to avoid the resistive effects of series parasitic resistances of other transistors in the source node or drain node, and to avoid the transistor conductance variations of all the transistors in the read path. The loading current is waveshaped to reduce possible overshoot and settling effects to achieve the fine output voltage resolution in an optimal sensing time.

For the purpose of illustration, a typical NAND memory string consisting of 8 series connected memory cells, one bitline select NMOS and one source line select NMOS is described. In a typical device, many such strings are connected in parallel and possibly in series to create a sector. A memory array could have one P-substrate for all sectors, or several P-substrates with each P-substrate shared across a few sectors to minimize capacitive loading in erase. In particular, in erase, the same P-substrate HV is applied to all the unselected rows to inhibit erasing. Fowler-Nordheim tunneling is used for both erase and programming. The erase is done by applying a high voltage HV, e.g. 20V, on the P-substrate and a low voltage, e.g. 0V, on the gates of the 8 memory cells for typically 1 ms. The electric fields across the tunnel oxides between the substrate and the floating gates are high enough to cause electrons to tunnel from the floating gates to the substrate. The net result is the reduction of the cell threshold voltage from a high value, for example, 2V, to a low value, for example −1.0V. The erase is normally done for one sector or many sectors, depending on the array architecture. The erase is selectively inhibited by not applying a high voltage to the substrates of the other sectors, or by applying the same high voltage at the same time to the gates of the inhibited memory cells in the same sector.

The programming is done in an iterative and incremental manner by grounding the substrate and the bitline and applying a series of incremental high voltage (HV) pulses, e.g., from 10V to 18V on the gate of the selected cell. The high voltage pulses will capacitively couple the floating gates to a high voltage. The resulting high electric field between the floating gates and the substrate will cause Fowler-Nordheim electron tunneling from the channel on the substrate to the floating gates. A column is unselected by causing the channels of the unselected string to be coupled to a high voltage, thus reducing the field across the unselected cells. An intermediate level, for example 9V, is applied to the gates of the unselected cells to inhibit programming when a high level is on the channel of the unselected cells. The net result is the incremental increase in the selected cell threshold voltage. A verify read cycle is done after each incremental HV programming pulse. When the desired output voltage is reached, the bitline is switched to an inhibit voltage, for example, 9V, to stop programming. The desired threshold resolution is typically traded off for programming time. For example, given a programming pulse width and an operating threshold window, more pulses are needed to cover the threshold programming window if the incremental programming level is smaller.

In the read-back mode, the storage cell is connected in a source follower mode with a waveshaped current load. The source line is biased at VREF1, a current Iload is connected to the bitline, the gate of the selected cell is biased at VREF2, the gates of the other unselected cells are biased at VREF3, and the gates of the bitline and source line select transistors are biased at VREF4. (VREF1 and VREF2 may in general be different voltages, though could be made equal to each other depending on the threshold of programmed cells.) The conditions for the voltage levels are such that the selected cell is operating in the saturation mode and the unselected cells and the select transistors are operating in the linear mode. Since the final value of the load current is practically zero amps, the voltage drop across the parasitic resistors is substantially equal to zero volts. Also since the final value of the load current is practically zero and the select transistors and the unselected memory cells are operating in the linear region, the voltage drop across them is also substantially equal to zero volts. And since the selected memory cell is operating in the saturation region with the load current substantially equal to zero amps, the source voltage, i.e. the memory cell output voltage of the selected cell, is equal to its gate voltage minus the threshold voltage. Hence a linear relationship is obtained between the threshold voltage and the cell output voltage. Since the cell threshold voltage is incrementally controlled by the incremental programming, the cell output voltage is also controlled incrementally to reach a desired programmed voltage. Thus no voltage variation on the drain or source is possible due to different threshold voltages of the unselected memory cells, different values of the parasitic resistance, or due to transistor conductance variation of all the transistors in the storage cell string. Note also that in NAND structures with multiple memory cells in series, the gate voltages of the unselected memory cells cannot be taken arbitrarily high to reduce the resistive effect due to disturb effects (undesired threshold shifts in the nonselected cells), but a similar result is achieved by the substantially zero load current of the present invention during a read.

DETAILED DESCRIPTION OF THE INVENTION

Figure 1:
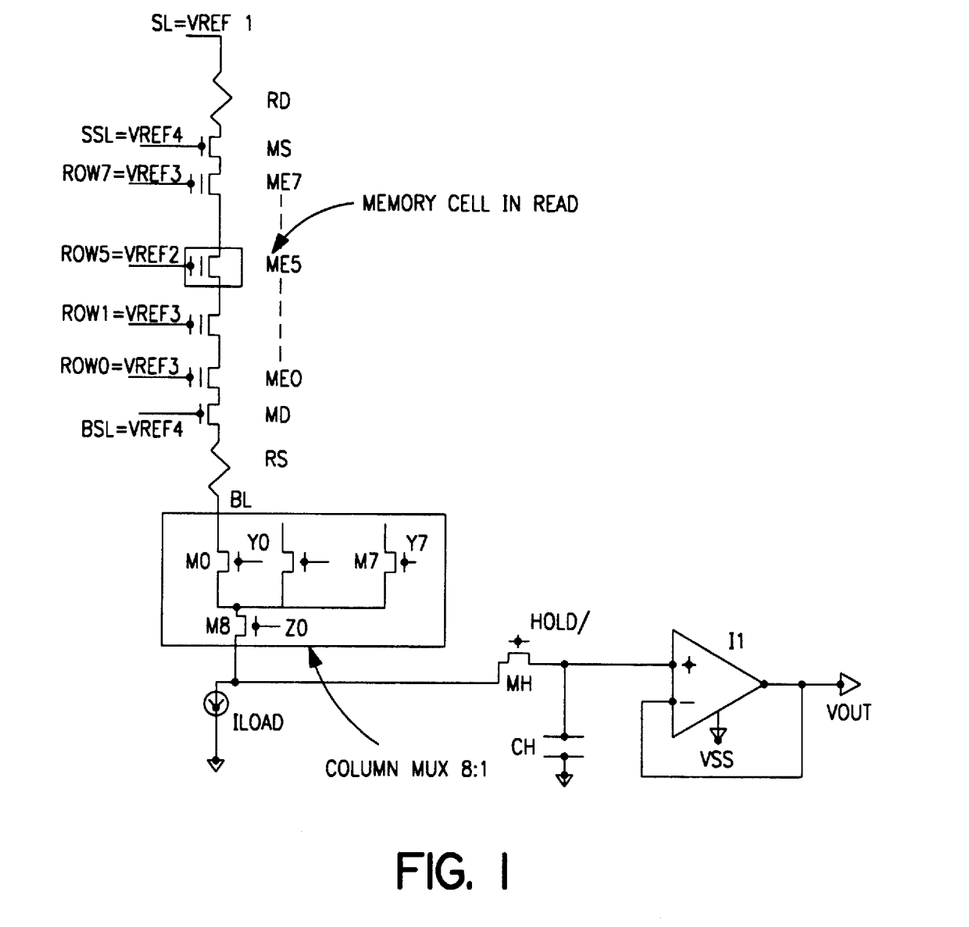
FIG. 1 is a circuit diagram illustrating a NAND storage cell structure in the read mode.
Figure 2:
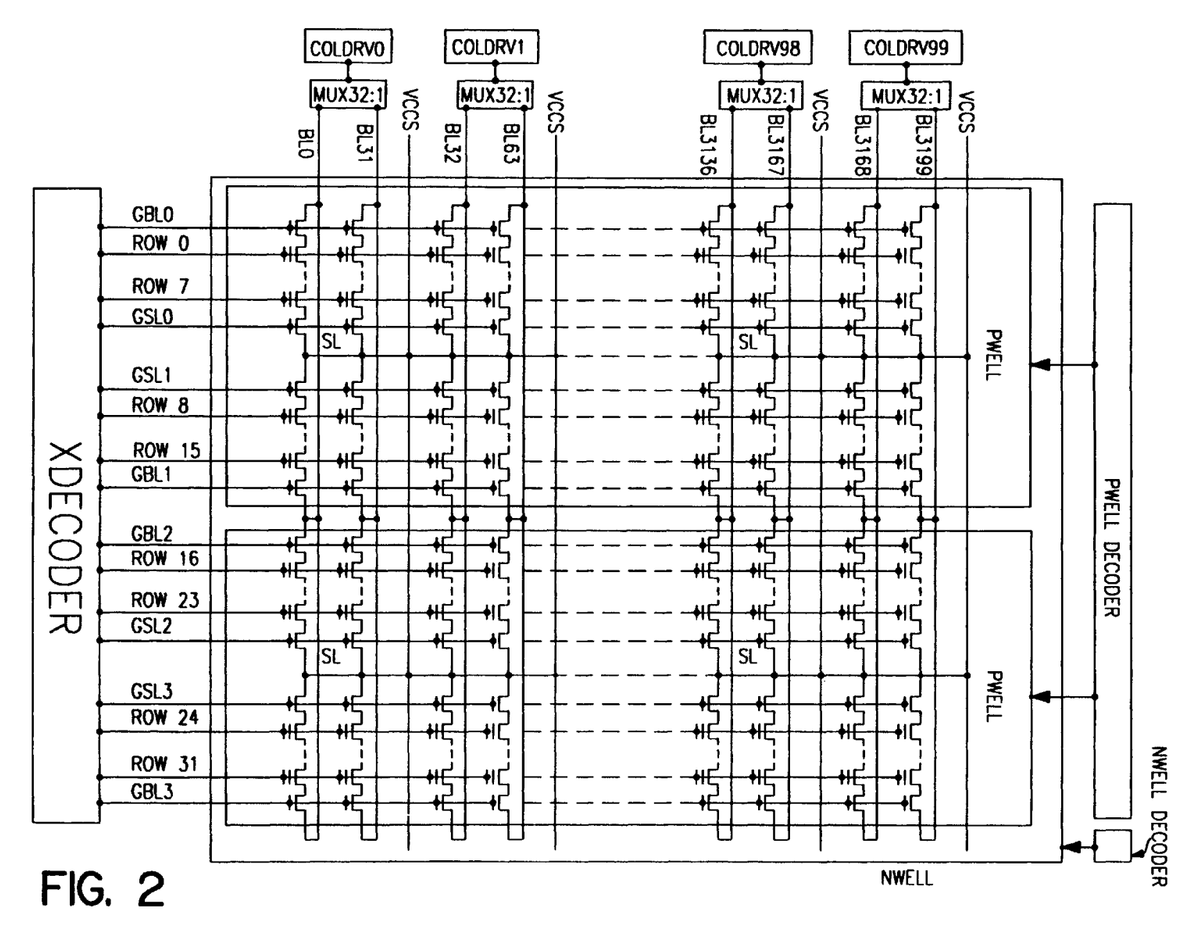
FIG. 2 is a diagram illustrating an array of NAND storage cell structures.

The storage cell structure used in the present invention is a typical NAND flash memory string similar to that described for digital memory storage by K. Suh et al., in ISSCC Digest of Technical Papers, pp. 128–129, Feb., 1995 and by K. Imamiya et al., in the ISSCC Digest of Technical Papers, pp. 130–131, Feb., 1995. As shown in FIG. 1, the memory string of the preferred embodiment consists of 8 memory cells ME0 through ME7 in series and two select transistors, one select transistor MD to select the bitline and one select transistor MS to select the source line. Typically many such strings are connected in parallel to create a sector, and many such sectors are connected to create a full memory array, as shown in FIG. 2.

The primary purpose of using such a string structure is to reduce the number of contacts per memory cell. Here only one-half a contact is needed for 8 memory cells instead of one-half a contact for one memory cell as in a NOR structure, which has only one memory cell and no select transistors. Only one-half a contact is needed since two strings share the same contact. The vertical dimension along the bitline is now mainly limited by stacked poly pitch instead of contact size, contact to stacked poly gate, stacked poly pitch, and source width as in a NOR structure. The horizontal dimension along the wordline is limited as in a NOR structure, mainly by contact size, metal to metal and diffusion to diffusion spacing. The overall effect is a dramatic reduction in the chip area per memory cell. The tradeoff is slower access time due to memory cells in series and the complexity of the programming algorithm to avoid various disturb modes. Typically extensive cell characterization is needed to optimize various conditions. The slower access time is circumvented by doing a page read, i.e. reading multiple cells at the same time, hence the structure is normally well suited for serial read applications such as mass storage, but not well suited for random access read applications.

Here method and apparatus for using the NAND storage cell for analog memory storage in a source follower configuration with a zero current load is described.

Floating gate devices ME0 through ME7 are the memory cells, device MD is the select transistor for the bitline and device MS is the select transistor for the source line. RD is the parasitic resistance due to the source line diffusion, and RS is lumped parasitic resistance due to the interconnections. Devices M0 through M7 are the typical column select based on the column decoding. Device MH is the typical sample and hold switch. (Known techniques for charge canceling and feedthrough reduction could be employed.) Capacitor CH is the hold capacitor for the sample and hold, and I1 is a typical MOS analog differential op amp buffer. The buffer is part of the column driver circuit which provides the enabling and inhibiting voltages into the column in programming and also serves to read the voltage out of the memory cell. The bias current and the reference voltages are supplied from a reference circuit such as a standard CMOS bandgap reference.

In FIG. 1, device ME5 is shown to be selected for read. Also shown are exemplary waveforms for the load current and relevant voltages. The read cycle begins with the load current Iload ramping up rapidly to Imax at t0 (see FIG. 3) to stabilize the output node voltage VOUT at a voltage close to the final voltage. Then Iload ramps down from Imax at t1 to Imin at t2 to minimize possible overshoot and settling. After some time t2, the output node VOUT is well stabilized, and the hold switch MH is opened to hold the output voltage on the hold capacitor CH, completing the read cycle.

Figure 3:
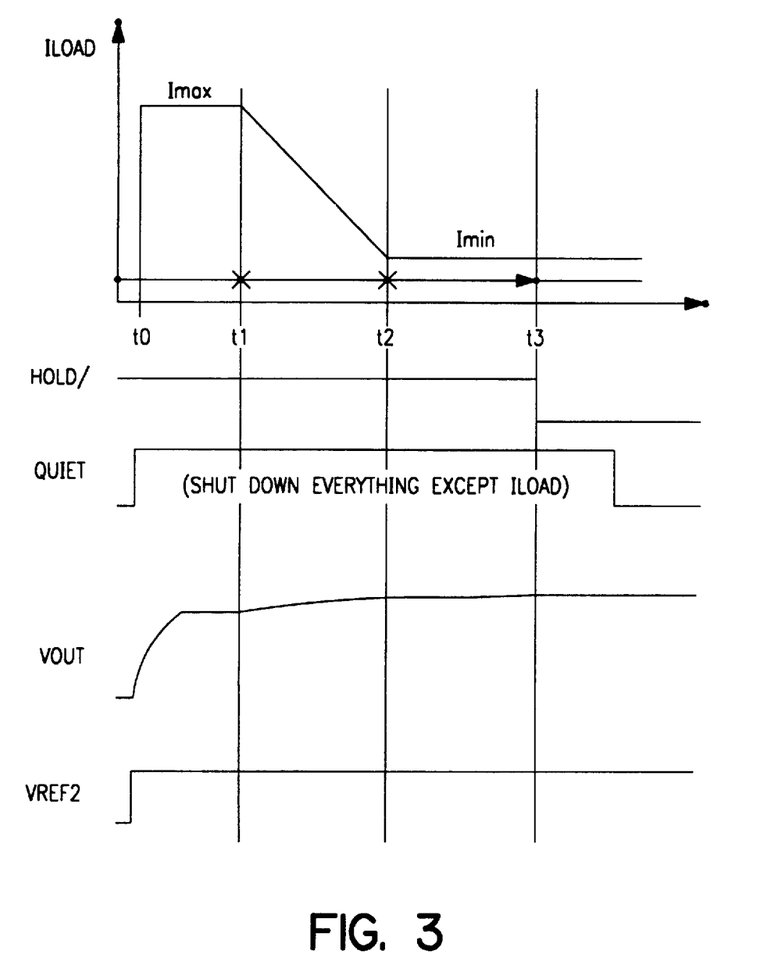
FIG. 3 is an illustration of the load current and associated signal waveforms during the read of the NAND storage cells of the present invention.

Also shown is a signal called QUIET, which effectively shuts down all possible circuits on the integrated circuit except the Iload and its associated circuits during the critical read period. Shutting down other circuits minimizes any possible noise coupling from the other active circuits on the chip to provide a more accurate read.

The timing should be optimized for a particular array architecture and circuit configuration. For example, t1, t2 and t3 relative to t0 could be nanoseconds to hundreds of nanoseconds to a few microseconds, depending on factors such as the bitline capacitance and desired output voltage resolution. Longer times result in finer output voltage resolution. The time duration t2 −t1 is limited on the minimum side by the possibility of overshoot, and if overshoot is not encountered, the change from Iload=Imax to Iload=Imin may be a rapid step.

Shown in FIG. 3 is the output voltage VOUT, which is not to actual scale. During the duration of Imax (from time t0 to time t1) the output voltage VOUT will rather quickly rise toward a stable level with a reasonably low RC time constant because of the various devices being turned on relatively firmly to conduct the current Imax. However the output voltage VOUT will be somewhat low and not an accurate measure of the threshold of the selected cell because of the inconsistent and unknown voltage drop through the other cells connected in series. Between time t1 and t2, the current is reduced to Imin in a manner to avoid overshoot, during which time VOUT increases because of the reduced voltage drop in the series devices. After time t2, the voltage VOUT will rise somewhat further toward a new, somewhat higher stable level, this time with a considerably higher RC time constant because of the device being read being biased at its threshold and not being turned on very firmly.

The conditions for voltage levels are such that the dynamic range is optimized while disturb is minimized. VREF1, VREF2 determine the output dynamic range directly. To ensure the selected cell is in saturation for linearity reasons, VREF2$\leq$VREF1+Vtmin, where Vtmin is the minimum threshold voltage of the memory cell. VREF3 should be $\geq$VREF1+Vtmax, where Vtmax is the maximum threshold voltage of the memory cell. VREF4$\geq$VREF1 +VtMD. The conditions for VREF3 and VREF4 are needed to ensure minimum voltage drop from the gate voltages along the series transistor chain. Normally some overdrive (voltages over the minimum specified) is needed to enhance the reading speed. In addition, VREF3$\leq$VDISTURB for the unselected cells, as VDISTURB will cause undesired threshold shifts for the erased unselected cells. VDISTURB is normally determined by characterization of single cell performance over the expected disturb time period.

For purposes of explanation, disturb effects are defined as the undesired condition under which the cell threshold shifts a certain amount. For digital non-volatile memory, 100–500 mV is typically used. For analog storage, a typical number on the order of 8 mV is used. The undesired condition happens during read, program, or erase of a selected cell or cells. It could happen for unselected cells or selected cells. For example, to read one cell, the cell is also disturbed at the same time. Obviously, different disturb effects exists for different technologies (EEPROM, NAND, DINOR, AND, NOR , etc. . . ), different array and circuit implementations, and different applications.

The disturb time period is dependent on the array architecture, circuit implementation, and the product application. For example, Information Storage Devices, Inc. (ISD) guarantees 10 years of storage retention. This means the fixed disturb time is 10 years if reading continuously on one cell. Normally no one reads one cell continuously for 10 years. However, 10 years is still used as the worst case for read disturb for the unselected cells.

As an exemplary set of values, let VREF1=3V, VREF2=2.5V, VREF3=5.5V, VREF4=5.5V, for Vtmin=−0.5V, and Vtmax=2.0V, wherein the Vt (threshold) numbers include the body effect of the memory cell. A dynamic range of 2.5V, from 0.5V to 3.0V, will be expected, wherein 0.5=VREF2−Vtmax=2.5−2.0, and 3.0V=VREF2−Vtmin=2.5−(−0.5). Imax could be several microamps, and Imin could be tens to hundreds of nanoamps, or possibly zero nanoamps. Some nonzero current in the nanoamp range is preferred however, to sink, for example, some possible field leakage or some weak noise coupling. A nonzero Imin also helps to stabilize the final output voltage without causing any significant voltage drop since the current magnitude is minuscule, 3 orders of magnitude smaller than Imax, i.e., nanoamps compared to microamps.

As the current Iload is reduced, the gate bias voltage for each of the current load devices across the memory array also reduces. Due to non-uniformity, the precise small current values and current-time profiles are different across the array. However each current load will ultimately reduce to substantially zero, the precise time at which the substantially zero current is reached not being important because the sensing of VOUT is done after that.

The present invention is compatible with various of the other aspects of the existing ISD analog storage devices. For instance, the variation of the memory cell output voltage over temperature could be minimized by utilizing a reference scheme as described by Richard T. Simko in the U.S. Pat. No. 5,126,967.

Table 1 shows various operating conditions for erase, programming, and read modes. In programming, the source line select transistor MS is needed to isolate the inhibit bitline voltage, =~9V, on the adjacent unselected bitlines of the same sector from the source line voltage, which would be zero volts if there is no transistor MS, since all the rows on the erased sector are on, equal to 9V or 10–18V, and the selected bitline is at 0V. In programming, the bitline select transistor MD is also needed to isolate the inhibit bitline voltage, =~9V, on the adjacent unselected bitlines of the same sector from the drains of the first memory cells of other sectors sharing the same unselected bitlines. This would cause unwanted erasing of those memory cells. Select transistor MS also allows all the source lines to be strapped together by metal lines since the source line of any sector is now individually selected by the transistor MS.

TABLE 1

CONDITIONS FOR ERASING CELLS 0 THROUGH 7
AND FOR PROGRAMMING AND READING CELL 5 OF
AN EIGHT NAND CELL STRING

|  | ERASE | PROGRAMMING | PROGRAM INHIBIT | READ |
| --- | --- | --- | --- | --- |
| SL | FL | 0 | 0 | VREF1 |
| BL | FL | 0 | 9 | Iload |
| ROW 5 | 0 | 10–18 | 10–18 | VREF2 |
| ROW 0–4,6–7 | 0 | 9 | 9 | VREF3 |
| SSL | FL | 0 | 0 | VREF4 |
| BSL | FL | 9 | 9 | VREF4 |
| other BLs | FL | VINHIBIT e.g. 9V. | VINHIBIT e.g. 9V. | FL |
| P-substrate | 20 | 0 | 0 | 0 |

Where:
FL=electrically floating
Iload=waveshaped load current (read bias current applied through column multiplexer).

In the present invention, the NAND memory cell configuration is used in an analog storage device in spite of the unpredictable resistances to be encountered in the NAND connected cells during playback. This is achieved by reading a cell by a two step, or multi-step read wherein a high read current is first used to obtain a quickly settling, though inaccurate readout voltage, followed by a very low, substantially zero readout current to allow the readout voltage to resettle at a more accurate readout voltage because of the now negligible voltage drops across the other resistances in the NAND connection because of the very low current.

As an alternative, a similar effect can be obtained by discharging the hold capacitor CH before each read by momentarily shorting the capacitor to ground through an n-channel device. Then when a read operation is initiated, the read current will be initially relatively high because of the output driving the load capacitor starting from ground level. Now as the output voltage approaches the threshold of the cell being read, the current will automatically decrease toward a substantially zero value. After a few time constants the current will decrease to substantially zero and the output voltage will be an accurate read of the cell being read. The cell should be read in any event while the current is still on the order of or above the expected field leakage and noise so that the output does not drift above a true cell output reading. In that regard, the ultimate near zero read current is preferably at least one order of magnitude below the initial read current, more preferably at least two, and can be on the order of three orders of magnitude below the initial read current. Further, depending on the characteristics and direction of the field leakage and noise coupling, Imin as defined in FIG. 1 may be made to be equal to zero and still obtain a stable cell read voltage accurately reflecting the cell programming unaffected by the other resistances in the NAND cell connection.

It should be noted that analog storage devices used to store and playback audio signals of the type manufactured by Information Storage Devices are a form of sequential access device, limited random access type capabilities only being used to point to the start of a free recording region or the start of a recorded message, not to individual cells. Consequently one can define the order in which cells are accessed for recording, and of course playback will need to be in the same sequence. Referring to FIG. 1, this allows designing for the programming of cell ME0 of a NAND string of cells first, then cell ME1, then cell ME2, etc. This way, one is assured that the programming of cells physically between the cell being presently programmed and the source follower read circuitry will not change between the time the cell being presently programmed is determined to be properly programmed and programming of the cell stops, and the time the same is read out during playback. Thus, in the NAND structure, the cell readout value is not affected by cells programmed in subsequent programming cycles. When the foregoing programming sequence is followed, the zero current read of the present invention further improves the accuracy of recording and readback in such devices.

Figure 4:
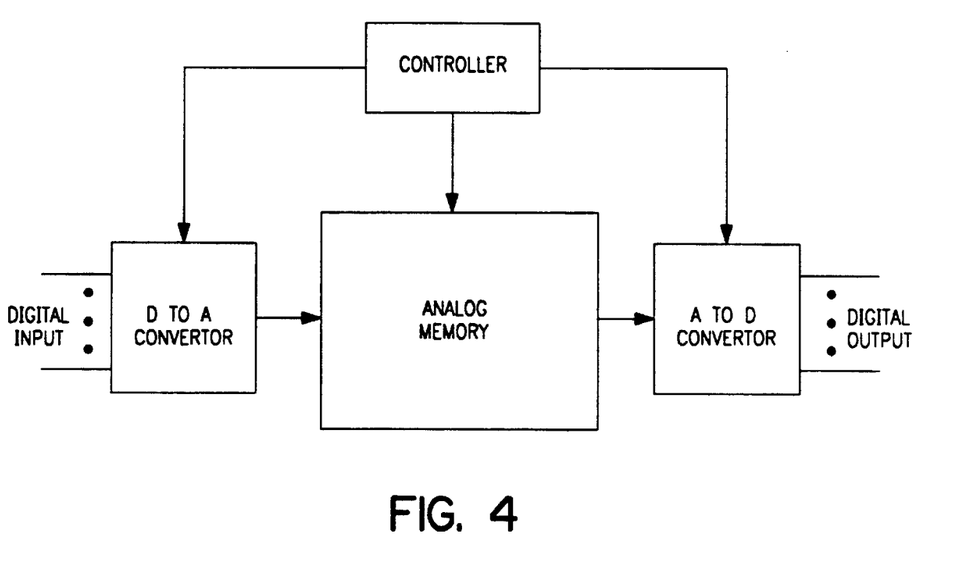
FIG. 4 illustrates the connection of data converters to an analog memory in accordance with the present invention to provide the storage and playback of a multi-bit digital value as a single analog voltage.

The present invention has been described with respect to its use and advantages in conjunction with analog storage in floating gate NAND structure storage cells. The very low or zero current during read of the present invention is also advantageous in enhancing read accuracy during playback or output of storage cells realized in other configurations and other technologies such as NOR and DINOR configurations, two transistor and one transistor cells and EPROM cells. Enhanced read-back accuracy is important not only in the storage and playback of analog signals, such as analog samples of an audio or other time varying analog signal on a one sample per cell basis, but also in the storage of digital signals, particularly in the storage and playback of digital signals stored as multi levels in each storage cell so as to store the equivalent of two or more bits of information in each cell. This may be achieved by the addition of an A/D converter at the input to the storage device and a D/A converter at the output of the device, as shown in FIG. 4. The magnitude of the number, or the number of bits in the digital word, is given by the voltage range of the stored analog level, divided by the guaranteed accuracy of storage. The accuracy of storage considers not only the increment during the programming sequence, but also factors such as noise, worst case programming increment, long term voltage retention characteristics of the cell and the effects of ambient temperature and operating voltage. An analog memory of the type described in the present invention should able to resolve a voltage to about 10 millivolts over a range of 2.5 Volts. While this allows about 250 distinct levels and a representation of up to 8 bits of binary information, after consideration of the above factors, the number of bits may be reduced to, say, 4 bits (16 levels spaced approximately 150 millivolts apart). Nevertheless, 4 bits to a single cell provides a significant improvement in the information storage density that can be achieved in a memory array, compared to the conventional digital storage which provides for only 1 bit per cell. In such a system, each N bit input signal, shown in FIG. 4 as a parallel signal though a serial signal could also be used, is converted to one of $2^N$ discrete voltage levels and stored as the respective level in a respective storage cell as described. Then on readout, the one of $2^N$ discrete voltage levels is reconverted to an N bit output signal, again shown in FIG. 4 as a parallel signal though a serial signal could also be used.

Thus while the present invention has been disclosed and described with respect to a certain preferred embodiment thereof, it will be understood to those skilled in the art that the present invention may be varied without departing from the spirit and scope thereof.

We claim:

1. A method of reading an analog value stored in any one of a plurality of storage cells, each having a source, a drain, a gate and a floating gate, the storage cells being connected in a NAND storage cell configuration with their sources and drains being coupled in series, comprising the steps of:
   (a) coupling a first reference voltage to the drain of first of the storage cells coupled in series;
   (b) coupling a second reference voltage to the gate of the storage cell to be read;
   (c) coupling a third reference voltage to the gates of the storage cells coupled in series with the storage cell to be read;
   (d) providing an initial load current through the drains and sources of the series of storage cells;
   (e) reducing the load current through the drains and sources of the series of storage cells to a value such that the total voltage drop across the storage cells coupled in series with the storage cell to be read is not more than the approximate resolution of the analog value stored in the storage cell to be read; and,
   (f) with the reduced load current through the series of storage cells, providing a read output voltage responsive to the voltage on the source of the storage cell to be read.

2. The method of claim 1 wherein the analog value is one of a plurality of discrete values each representing a specific multi-bit digital signal, and further comprising the step of converting the read output voltage to a respective multi-bit signal.

3. An analog storage system comprising:
   a plurality of storage cells, each having a source, a drain, a gate and a floating gate, the storage cells being connected in a NAND storage cell configuration with their sources and drains being coupled in series:
   means for providing a first reference voltage to the drain of first of the storage cells coupled in series;
   means for providing a second reference voltage to the gate of the storage cell to be read;
   means for providing a third reference voltage to the gates of the storage cells coupled in series with the storage cell to be read;
   means for providing an initial load current through the drains and sources of the series of storage cells, which load current then reduces to a value such that the total voltage drop across the storage cells coupled in series with the storage cell to be read is not more than the approximate resolution of the analog value stored in the storage cell to be read; and,
   means for providing, with the reduced load current through the series of storage cells, a read output voltage responsive to the voltage on the source of the storage cell to be read.

4. A method of reading a value stored in any one of a plurality of storage cells, each having a source, a drain, a gate and a floating gate, the storage cells being connected in a NAND storage cell configuration with their sources and drains being coupled in series, comprising the steps of:
   (a) coupling a first reference voltage to the drain of first of the storage cells coupled in series;
   (b) coupling a second reference voltage to the gate of the storage cell to be read;
   (c) coupling a third reference voltage to the gates of the storage cells coupled in series with the storage cell to be read;
   (d) providing an initial load current through the drains and sources of the series of storage cells;
   (e) reducing the load current through the drains and sources of the series of storage cells to a value such that the total voltage drop across the storage cells coupled in series with the storage cell to be read is not more than the approximate resolution of the value stored in the storage cell to be read; and,
   (f) with the reduced load current through the series of storage cells, providing a read output voltage responsive to the voltage on the source of the storage cell to be read.

5. The method of claim 4 wherein the stored value is one of a plurality of discrete values each representing a specific multi-bit digital signal, and further comprising the step of converting the read output voltage to a respective multi-bit signal.

6. A storage system comprising:
   a plurality of storage cells, each having a source, a drain, a gate and a floating gate, the storage cells being connected in a NAND storage cell configuration with their sources and drains being coupled in series:
   means for providing a first reference voltage to the drain of first of the storage cells coupled in series;
   means for providing a second reference voltage to the gate of the storage cell to be read;

means for providing a third reference voltage to the gates of the storage cells coupled in series with the storage cell to be read;

means for providing an initial load current through the drains and sources of the series of storage cells, which load current then reduces to a value such that the total voltage drop across the storage cells coupled in series with the storage cell to be read is not more than the approximate resolution of the value stored in the storage cell to be read; and, means for providing, with the reduced load current through the series of storage cells, a read output voltage responsive to the voltage on the source of the storage cell to be read.

7. The storage system of claim 6 further comprised of an analog to digital converter coupled to the means for providing a read output voltage to convert the read output voltage to a multi-bit digital signal.

* * * * *

UNITED STATES PATENT AND TRADEMARK OFFICE
CERTIFICATE OF CORRECTION

PATENT NO.   : 5,808,938
DATED        : September 15, 1998
INVENTOR(S)  : Hieu Van Tran, James Brennan, Jr., Trevor Blyth and Sukyoon Yoon It is certified that error appears in the above-identified patent and that said Letters Patent is hereby corrected as shown below:

<u>Title page,</u>
Item [22], delete "Jul. 2, 1997" and insert -- Jul. 1, 1997 --.

Signed and Sealed this

Twenty-sixth Day of August, 2003

JAMES E. ROGAN
*Director of the United States Patent and Trademark Office*